(12) United States Patent
Hsiao et al.

(10) Patent No.: US 8,665,513 B2
(45) Date of Patent: *Mar. 4, 2014

(54) ELECTRO-PHORETIC DISPLAY DEVICE AND FABRICATING METHOD THEREOF

(71) Applicant: E Ink Holdings Inc., Hsinchu (TW)

(72) Inventors: Po-Wen Hsiao, Hsinchu (TW);
Tzu-Ming Wang, Hsinchu (TW);
Kai-Cheng Chuang, Hsinchu (TW);
Yuan-Chih Tsai, Hsinchu (TW);
Chi-Ming Wu, Hsinchu (TW);
Jen-Shiun Huang, Hsinchu (TW);
Yung-Sheng Chang, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/664,897

(22) Filed: Oct. 31, 2012

(65) Prior Publication Data

US 2013/0057464 A1 Mar. 7, 2013

Related U.S. Application Data

(63) Continuation of application No. 12/776,457, filed on May 10, 2010, now Pat. No. 8,331,013.

(51) Int. Cl.
*G02B 26/00* (2006.01)

(52) U.S. Cl.
USPC .......................................... 359/296

(58) Field of Classification Search
USPC ......................................................... 359/296
See application file for complete search history.

(56) References Cited

U.S. PATENT DOCUMENTS

2008/0239460 A1* 10/2008 Shimizu et al. ............... 359/296
2010/0060974 A1* 3/2010 Wang et al. ................... 359/296

FOREIGN PATENT DOCUMENTS

CN 1883061 A 12/2006
CN 101533197 A 9/2009

* cited by examiner

*Primary Examiner* — James Jones
(74) *Attorney, Agent, or Firm* — Chun-Ming Shih (57) ABSTRACT

An electro-phoretic display device includes a first substrate, an active elements array, a driving circuit, a conductive flexible board, an electro-phoretic layer and a second substrate. The first substrate has a first surface defining a display area and a circuit area, and a second surface. The active elements array is disposed within the display area and the driving circuit is disposed within the circuit area and electrically connected to the active elements array. The conductive flexible board is partially disposed at the first substrate and electrically connected to the driving circuit. The electro-phoretic layer and the second substrate are sequentially disposed on the active elements array and the driving circuit. A fabricating method of electro-phoretic display device is also disclosed.

19 Claims, 7 Drawing Sheets

ELECTRO-PHORETIC DISPLAY DEVICE AND FABRICATING METHOD THEREOF

CROSS-REFERENCE TO RELATED APPLICATIONS

This application is a continuation application of an application Ser. No. 12/776,457, filed on May 10, 2010, and the entire contents of which are incorporated herein by reference.

BACKGROUND

1. Technical Field

The present invention is related to a display device and a fabricating method thereof, and particularly to an electro-phoretic display device and a fabricating method thereof.

2. Related Art

With the technology advances of flat panel displays, more and more electronic products, in particular, portable electronic products such as mobile phones, e-book readers, digital cameras, and personal digital assistants (PDA), etc., are equipped with flat panel monitors. With the trend of portable electronic devices towards lighter weight and thinner thickness, displays used for portable electronic device should also have features of light weight and thin thickness.

As mentioned above, since flexible displays not only have advantages of light weight and thin thickness, but also have advantages of flexibility and anti-impact, manufacture of flexible displays becomes an important trend in future development. Currently, commonly available flexible displays include electro-phoretic display devices (EPD), which utilize electric field to control the distribution of charged particles so as to change the reflectivity of a display area, thereby displaying image. Based on the principle of displays, electro-phoretic display devices have characteristics of bistability and need no extra light source, thus in line with requirements of modern technology that flexible displays should also have the feature of highly energy-saving.

Figure 1:
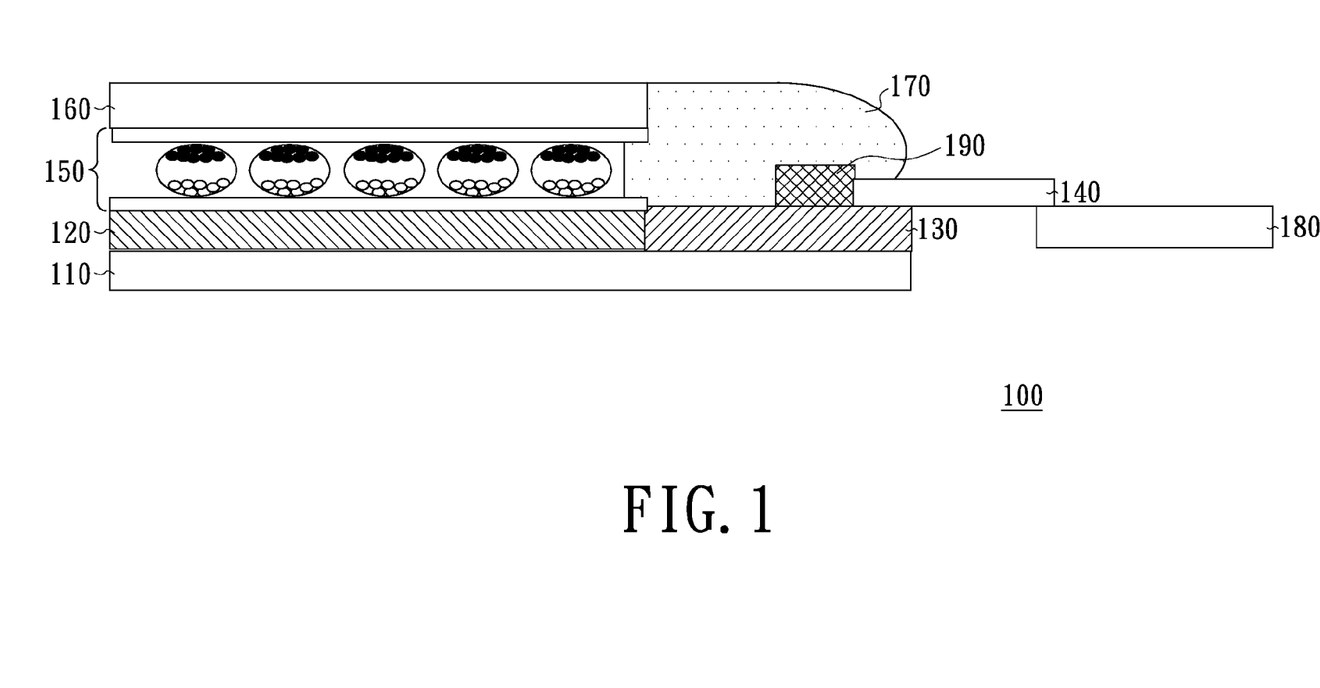
FIG. 1 is a cross sectional schematic view of a conventional electro-phoretic display device.

FIG. 1 is a cross sectional view of a conventional electro-phoretic display device. Referring to FIG. 1, the electro-phoretic display device 100 includes a first substrate 110, an active elements array 120, a driving circuit 130, a conductive flexible board 140, an elector-phoretic display layer 150, a second substrate 160, a sealant 170, and a driving chip 190. The active elements array 120 and the driving circuit 130 are disposed on the first substrate 110, and the electro-phoretic layer 150 is disposed on the active elements array 120. The driving chip 190 and the conductive flexible board 140 are disposed on the driving circuit 130. In addition, the driving chip 190 is electrically connected to the active elements array 120 via the driving circuit 130, and also electrically connected to a printed circuit board (PCB) 180 via the conductive flexible board 140. The second substrate 160 is disposed on the electro-phoretic display layer 150 and the sealant 170 is formed on the driving circuit 130. The sealant 170, on the one hand, protects the driving circuit 130, and on the other hand, seals the electro-phoretic display layer 150 between the second substrate 160 and the first substrate 110 to prevent the electro-phoretic display device 100 from damages resulted from ambient air or steam infiltration.

However, if the polymerization time is not accurately controlled during the process of forming sealant 170, then the obtained sealant 170 can not effectually protect the driving circuit 130 from corrosion by outer environments due to incomplete polymerization. In addition, the sealant 170 is disposed adjacent to the electro-phoretic display layer 150, thus when ambient temperature of the electro-phoretic display device 100 changes, the difference of thermal expansion coefficient between the sealant 170 and the electro-phoretic layer 150 will lead different thermal stress to the first substrate 110 and the driving circuit 130. Then, the sealant layer 170 may break, or the driving circuit 130 may be damaged.

BRIEF SUMMARY

The present invention provides an electro-phoretic display device, wherein an electro-phoretic layer covers both an active elements array in a display area and a driving circuit in a circuit area. Thus, damage of the driving circuit caused by uneven stress can be avoided.

The present invention also provides a fabricating method for an electro-phoretic display device, which has improved yield rate, and the electro-phoretic display device has a long life time.

An electro-phoretic display device includes a first substrate, an active elements array, a driving circuit, a conductive flexible board, an electro-phoretic display layer and a second substrate. The first substrate has a first surface which includes a display area and a circuit area. The active elements array is disposed in the display area of the first substrate, and the driving circuit is disposed in the circuit area of the first substrate and is electrically connected to the active elements array. The conductive flexible board is partially disposed on the first substrate and is electrically connected to the driving circuit. The electro-phoretic display layer and the second substrate are sequentially disposed on the active elements array and the driving circuit.

In a preferred embodiment of the present invention, the electro-phoretic display device further includes a driving chip disposed in the circuit area of the first substrate and is electrically connected to the driving circuit. In addition, the elector-phoretic display layer has an opening exposing the driving chip.

In a preferred embodiment of the present invention, the electro-phoretic display device further includes a driving chip, and the conductive flexible board is a flexible printed circuit board (FPCB). The driving chip is disposed on the FPCB.

In a preferred embodiment of the present invention, the first substrate is made of plastic.

In a preferred embodiment of the present invention, the first substrate is made of polyimide (PI), polyethylene terephthalate (PET), polyethylene naphthalate (PEN), aromatic polyamide, polycyclic olefin, polysulfone (PSU), epoxy resin, polycarbonate (PC), or polymethyl methacrylate (PMMA).

In a preferred embodiment of the present invention, the electro-phoretic display device further includes a flexible support plate adhered to a second surface of the first substrate. The second surface is opposite to the first surface.

In a preferred embodiment of the present invention, the electro-phoretic display layer includes a micro-cup electro-phoretic display layer, or a micro-capsule electro-phoretic display layer.

The present invention also provides a fabricating method of an electro-phoretic display device, including the following steps. Firstly, a first substrate with a first surface is provided. The first surface includes a display area and a circuit area. Then, an active elements array and a driving circuit are formed in the display area and the circuit area of the first substrate, respectively. The active elements array and the driving circuit are electrically connected to each other. After that, a conductive flexible board is partially disposed on the first substrate and is electrically connected to the driving circuit. Then, an electro-phoretic display layer is disposed on the active elements array and the driving circuit, and a second substrate is formed on the electro-phoretic display layer.

In a preferred embodiment of the present invention, before disposing the electro-phoretic display layer on the active elements array and the driving circuit, a driving chip is further disposed on the driving circuit and is electrically connected to the driving circuit.

In a preferred embodiment of the present invention, before disposing the electro-phoretic display layer on the active elements array and the driving circuit, an opening is further formed in the electro-phoretic display layer. After the electro-phoretic display layer is disposed on the active elements array and the driving circuit, the opening exposes the driving chip.

In a preferred embodiment of the present invention, after disposing the electro-phoretic display layer on the active elements array and the driving circuit, the opening of the electro-phoretic display layer is further filled into a filling layer.

In a preferred embodiment of the present invention, the steps of forming the first substrate include the followings. Firstly, a rigid base is provided. Next, a plastic layer is formed on the rigid base. Then, the plastic layer is solidified to obtain the first substrate.

In a preferred embodiment of the present invention, a method of forming the plastic layer includes spin coating, ink jet printing, screen printing or slit coating.

In a preferred embodiment of the present invention, after forming the second substrate, the rigid base is further separated from the first substrate.

In a preferred embodiment of the present invention, after separating the rigid base and the first substrate, a flexible support plate is further adhered to a second surface of the first substrate. The second surface is opposite to the first surface.

In a preferred embodiment of the present invention, separating the rigid base and the first substrate is performed by a laser separating process.

In a preferred embodiment of the present invention, the wavelength of the laser used for separating the rigid base and the first substrate is in a range from 300 nanometers to 400 nanometers.

In the electro-phoretic display device of the present invention, the electro-phoretic display layer covers both the active elements array and the driving circuit. Thus, the electro-phoretic display layer is a protective layer of the driving circuit. Therefore, when ambient temperature of the electro-phoretic display device changes, the damage of the driving circuit caused by uneven thermal stress can be avoided. In addition, because the sealant of the electro-phoretic display device is disposed at the edge of the driving circuit, the damage to the driving circuit caused by poor quality of process can be reduced while forming sealant layer. Therefore, the present invention not only increases the life time of the electro-phoretic display device, but also improves the yield rate of the electro-phoretic display device.

Other aspects, details, and advantages of the present electro-phoretic display device are further described accompanying with preferred embodiments and figures as follows.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Figure 2:
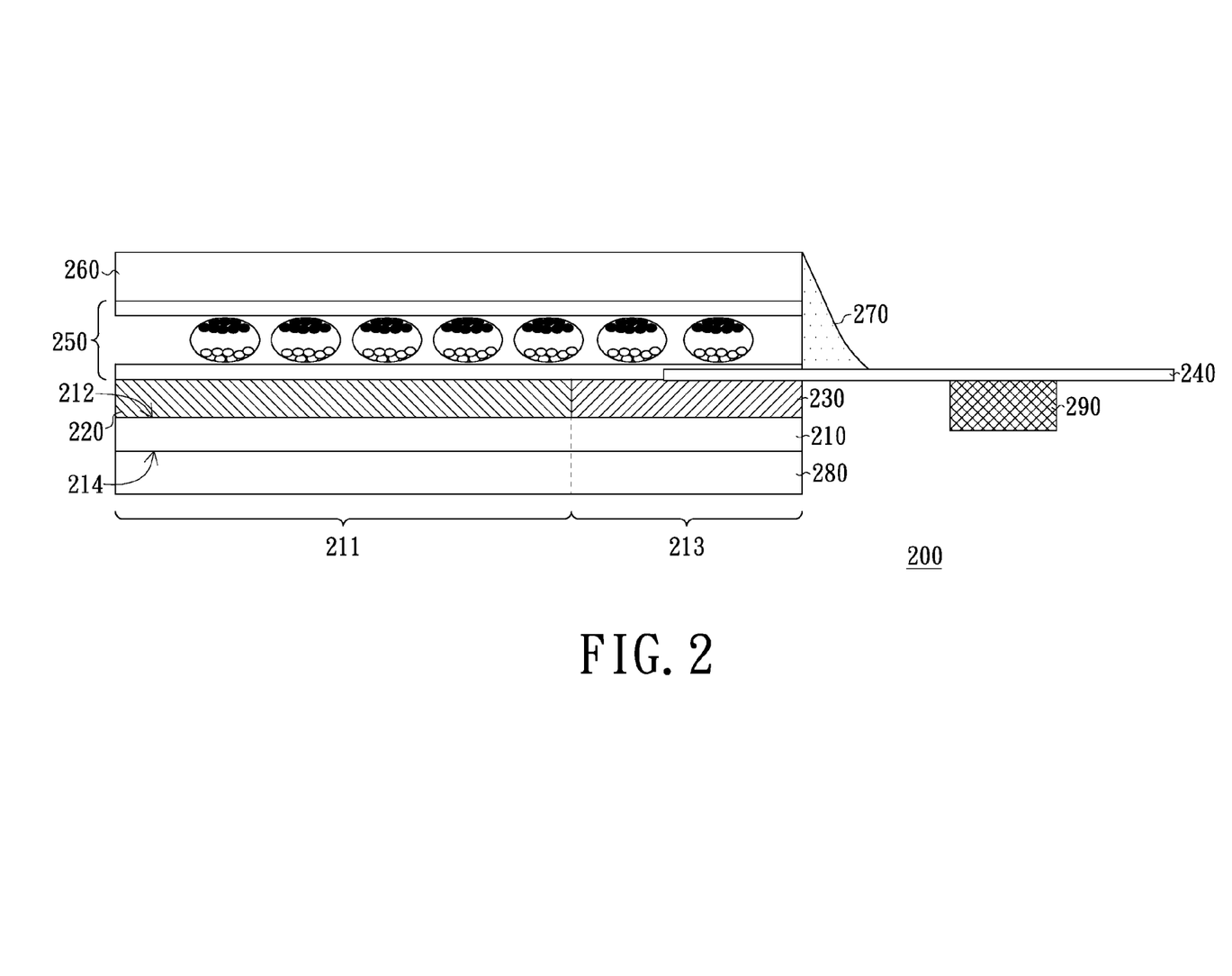
FIG. 2 is a partial cross section schematic view of an electro-phoretic display device in accordance with an embodiment of the present invention.

FIG. 2 is a partial cross sectional schematic view of an electro-phoretic display device in accordance with an embodiment of the present invention. Referring to FIG. 2, an electro-phoretic display device 200 includes a first substrate 210, an active elements array 220, a driving circuit 230, a conductive flexible board 240, an electro-phoretic display layer 250, a second substrate 260, and a sealant 270. The first substrate 210 has a first surface 212, and the first surface 212 includes a display area 211 and a circuit area 213. The first substrate 210 of the present embodiment can be a flexible substrate made of plastic. Specifically, the first substrate 210 can be made of polyimide (PI), polyethylene terephthalate (PET), polyethylene naphthalate (PEN), aromatic polyamide, polycyclic olefin, polysulfone (PSU), epoxy resin, polycarbonate (PC), or polymethyl methacrylate (PMMA).

Particularly, to further improve the structure intensity of the electro-phoretic display device 200, in the present embodiment, a flexible support plate 280 is disposed on a second surface 214 of the first substrate 210 to protect the first substrate 210 from being damaged by external force. The flexible support plate 280 is, for example, made of a material the same as or similar to the material of the first substrate 210.

The active elements array 220 is disposed in the display area 211 of the first substrate 210. In the present embodiment, the active elements array 220, for example, is a thin film transistor array (TFT array). The driving circuit 230 is disposed in the circuit area 213 of the first substrate 210, and is electrically connected to the active elements array 220. The driving circuit 230 is used to control an operation state of the active elements array 220. The conductive flexible board 240 is partially disposed on the first substrate 210, and is electrically connected to the driving circuit 230. In the present embodiment, the conductive flexible board 240, for example, is a flexible printed circuit board (FPCB). The driving chip 290 for providing control signals is disposed on the conductive flexible board 240. In other words, the disposition of the driving chip 290 in the present embodiment is in a manner of chip on film (COF).

Continuing referring to FIG. 2, the electro-phoretic display layer 250 and the second substrate 260 are sequentially disposed on the active elements array 220 and the driving circuit 230. The electro-phoretic display layer 250 can be a micro-cup electro-phoretic display layer or a micro-capsule electro-phoretic layer. The second substrate 260 can be a transparent plastic plate, and the material of the second substrate 210, for example, is the same as or similar to the material of the first substrate 210. In addition, the second substrate 260 can also be a color filter.

The sealant 270 is adhered between the second substrate 260 and the conductive flexible board 240 to seal the electro-phoretic display layer 250 between the first substrate 210 and the second substrate 260 to avoid damaging the electro-phoretic display device 200 by ambient steam or pollutant infiltration. The sealant 270 can be made of plastic, such as ultraviolet curable polymer, silicone, or polyurethane. It should be noted that the sealant 270 of the present embodiment is disposed between the driving chip 290 and the electro-phoretic display layer 250. That is, the sealant 270 doesn't seal the driving chip 290 between the first substrate 210 and the second substrate 260.

Figure 3:
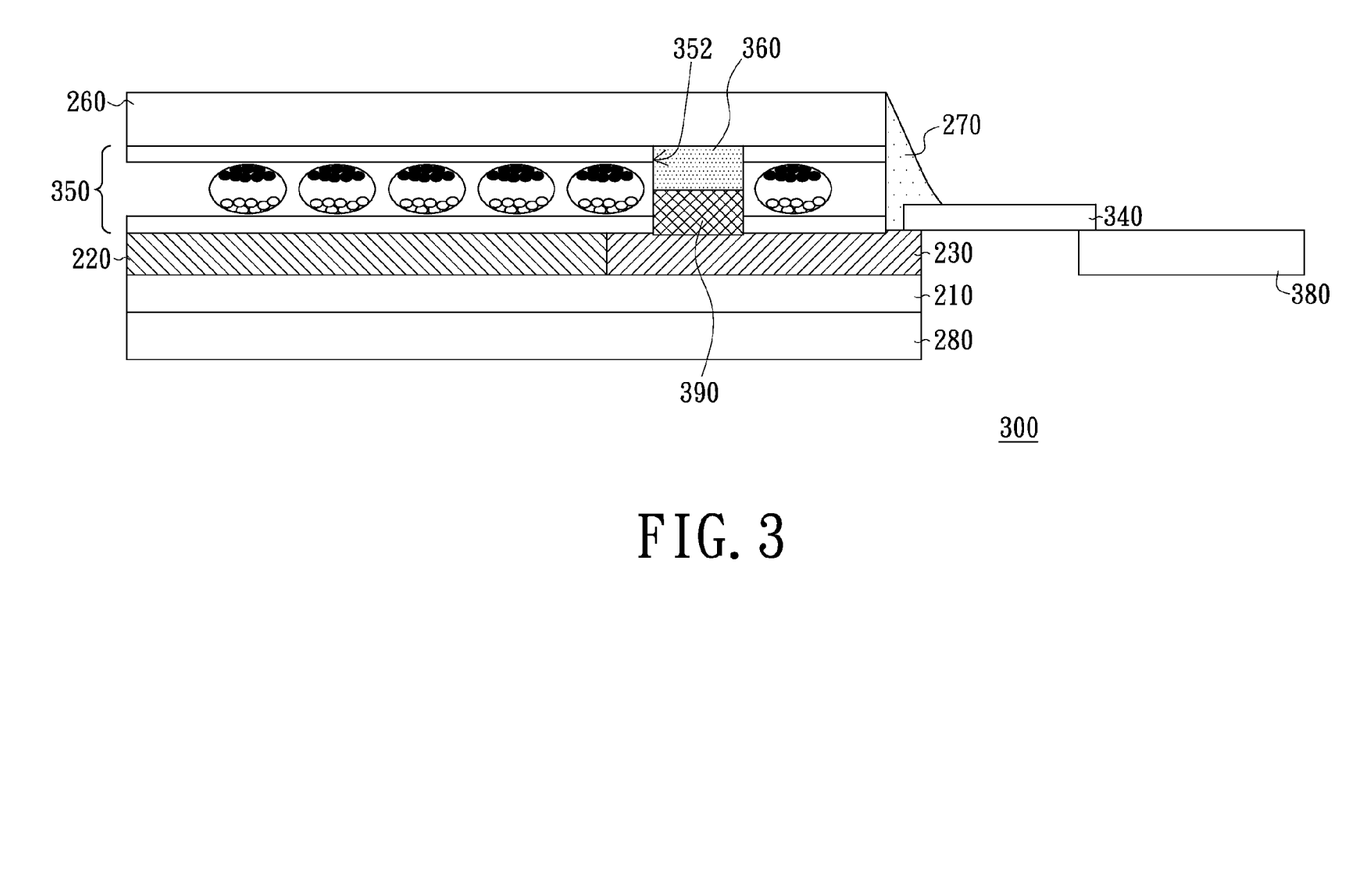
FIG. 3 is a partial cross section schematic view of an electro-phoretic display device in accordance with another embodiment of the present invention.

FIG. 3 is a partial cross sectional schematic view of an electro-phoretic display device in accordance with another embodiment of the present invention. Referring to FIG. 3, an electro-phoretic display device 300 includes a first substrate 210, an active elements array 220, a driving circuit 230, a conductive flexible board 340, an electro-phoretic display layer 350, a second substrate 260, and a sealant 270. In the electro-phoretic display device 300, elements with the same reference number as that of the electro-phoretic display device 200 have the same or similar structure, are made by the same or similar material, and have the same or similar function, and thus are not described in detail for brief purpose. The differences between the electro-phoretic display device 300 and the electro-phoretic display device 200 of the above describe embodiment are discussed.

In the present embodiment, the driving chip 390 for providing controlling signals is directly disposed on the first substrate 210, and is electrically connected to the driving circuit 230. In other words, the disposition of the driving chip 390 of the present embodiment is in a manner of chip on glass (COG). In addition, the conductive flexible board 340 is used for electrically connecting an external printed circuit board (PCB) 380 to the driving circuit 230.

Particularly, the electro-phoretic display layer 350 of the present embodiment has an opening 352 exposing the driving chip 390. Besides, to improve a structure intensity of the electro-phoretic display layer 350, the opening 352 of the present embodiment is filled with a filling layer 360. The material of the filling layer 360, for example, is the same as or similar to the material of the sealant 270.

In the electro-phoretic display device 200 and the electro-phoretic display device 300, the electro-phoretic display layer 250 and the electro-phoretic display layer 350 both cover the active elements array 220 and the driving circuit 230. In other words, the elector-phoretic display layer 250 and elector-phoretic display layer 350 not only change their transparency according to variation of an electric field in the display area 211 to enable the electro-phoretic display device 200 and the electro-phoretic display device 300 to display an image, but also act as a protective layer of the driving circuit 230. In addition, as the junction of the sealant layer 270 and the electro-phoretic layer 250, or the electro-phoretic layer 350 is at an edge of the first substrate, when ambient temperature changes, it is capable of avoiding damage to the driving circuit 230 caused by uneven thermal stress produced due to the different thermal expansion coefficient between the sealing layer 270 and the electro-phoretic layer 250, or the electro-phoretic layer 350.

To fully and clearly disclose the present invention, a fabricating method of above electro-phoretic display device is illustrated accompanying with figures as follows.

Figure 4A:
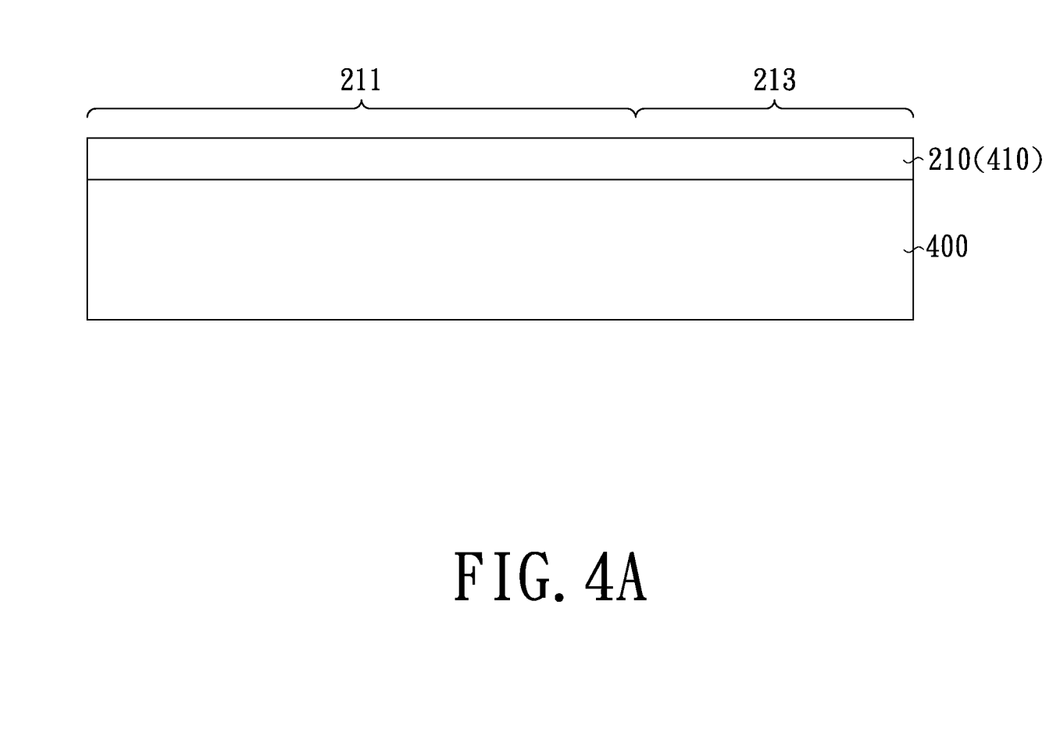
FIGS. 4A to 4D are cross sectional schematic views illustrating a fabricating method of electro-phoretic display device in accordance with an embodiment.

FIGS. 4A to 4D are cross sectional schematic views illustrating a fabricating method of electro-phoretic display device in accordance with an embodiment. Referring to FIG. 4A, firstly, a first substrate 210 is provided. The first substrate 210 has a first surface 212, and the first surface 212 has a display area 211 and a circuit area 213. It is worth to mention that the first substrate 210 can be a flexible substrate made of plastic material. The steps of forming the first substrate 210 include the followings. Firstly, a rigid base 400 is provided, and then a plastic layer 410 is formed on the rigid base 400 The plastic layer 410, for example, can be formed by spin coating, ink jet printing, screen printing, or slit coating on the rigid base 400. After that, the plastic layer 410 is solidified to form the first substrate 210.

Figure 4B:
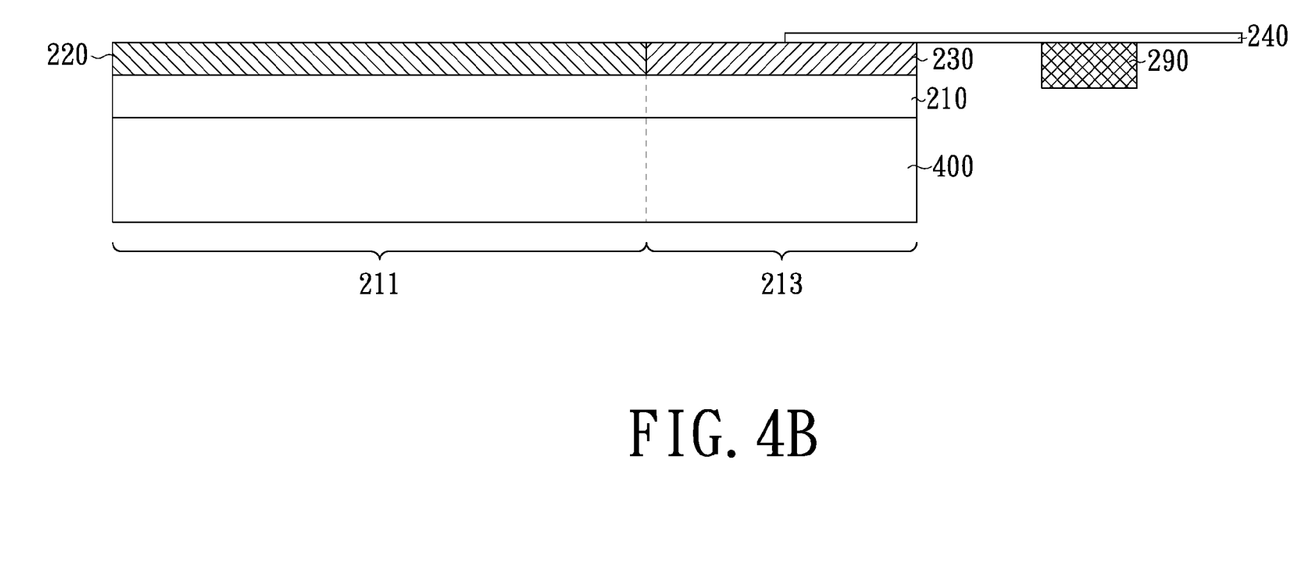

Referring to FIG. 4B, an active elements array 220 is formed in the display area 211 of the first substrate 210, and a driving circuit 230 is formed in the circuit area 213. The driving circuit 230 and the active elements array 220 are electrically connected to each other. In addition, the active elements array 220 and the driving circuit 230 can be formed on the first substrate 210 by the same semiconductor process. However, it is not limited in the present invention.

After the disposition of the driving circuit 230, the conductive flexible board 240 is disposed on a part of the first substrate 210, and is electrically connected to the driving circuit 230. The conductive flexible board 240, for example, is a flexible printed circuit board. The driving chip 290 is disposed on the conductive flexible board 240 before disposing the conductive flexible boards 240 on the first substrate 210.

Figure 4C:
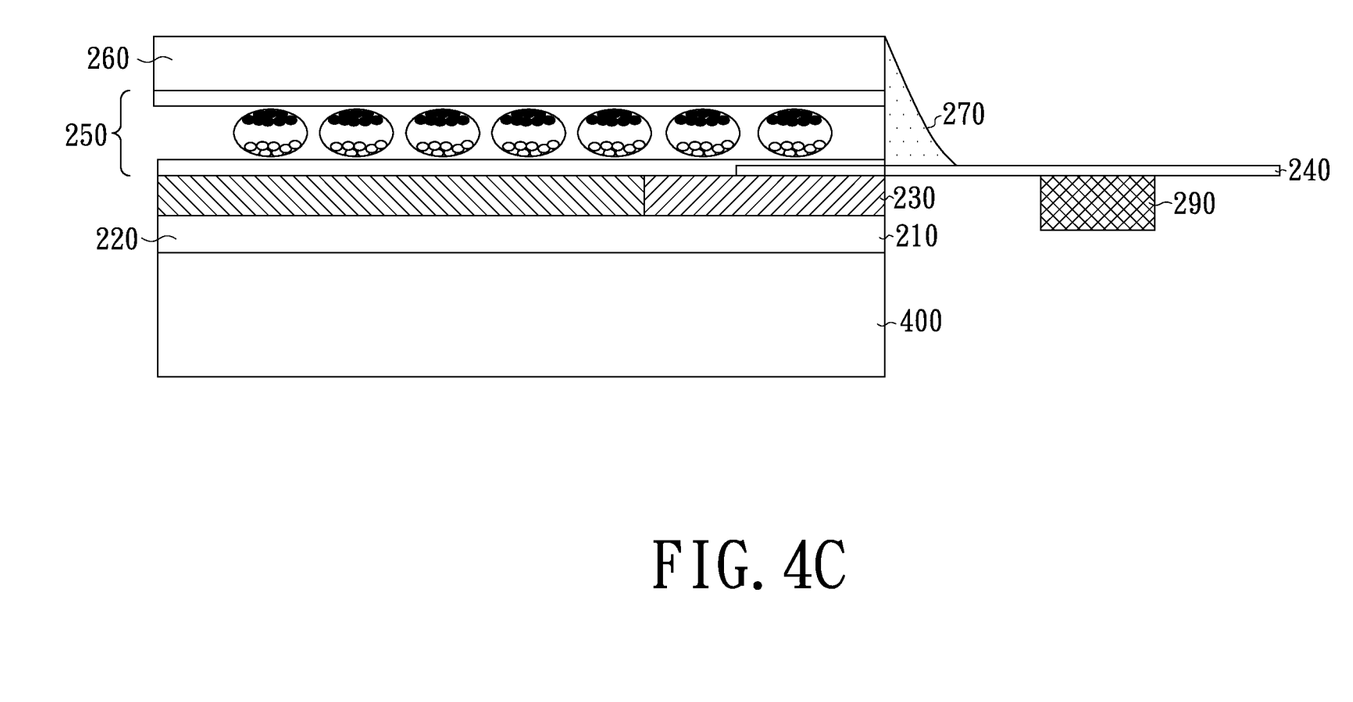

Referring to 4C, the electro-phoretic display layer 250 and the second substrate 260 are sequentially disposed on the active elements array 220 and the driving circuit 230. Then, a sealant 270 is formed between the second substrate 260 and the conductive flexible board 240 to seal the electro-phoretic display layer 250 between the first substrate 210 and the second substrate 260. Specifically, after the sealant 270 is coated between the second substrate 260 and the conductive flexible board 240, the sealant 270 is solidified using light radiation or other method according to the material of the sealant 270.

Figure 4D:
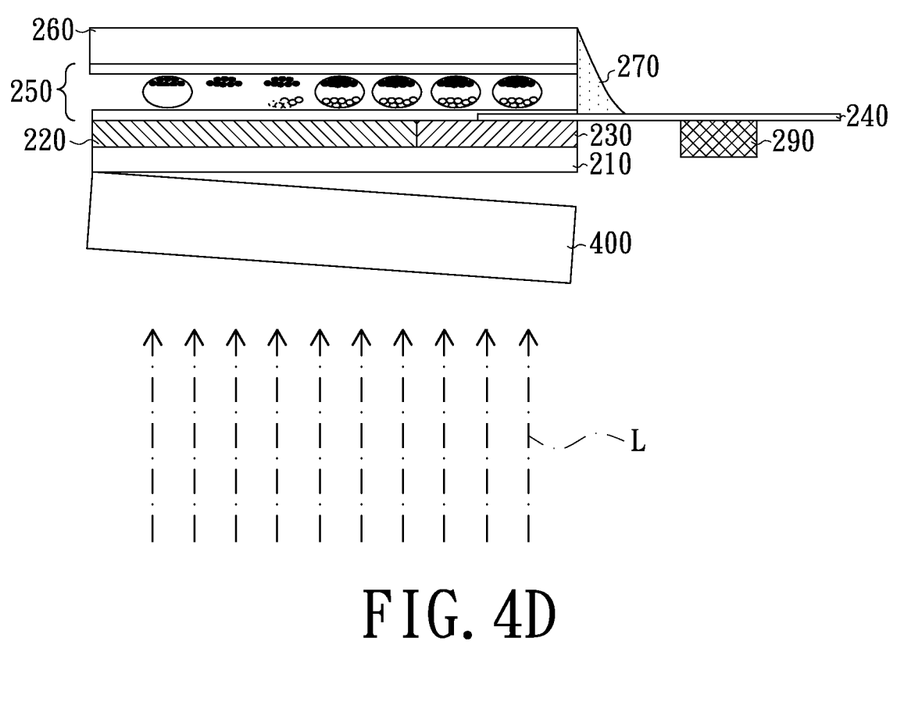

Referring to FIG. 4D, after the electro-phoretic display layer 250 is sealed between the first substrate 210 and the second substrate 260, the rigid base 400 is separated from the first substrate 210. In the present embodiment, for example, a laser L having a wavelength in the range from 300 nanometers to 400 nanometers is irradiated on the rigid base 400 so that the rigid base 400 can be separated from the first substrate 210. However, the method for separating the rigid base 400 form the first substrate 210 is not limited to that mentioned above.

In particular, as shown in FIG. 2, in the present embodiment, after the rigid base 400 is separated from the first substrate 210, a flexible support plate 280 is formed on the second surface 214 of the first substrate 210 to improve a structure intensity of the electro-phoretic display device 200.

It is noteworthy that in the present embodiment, the driving chip 290 is disposed using a chip on film manner to electrically connect to the driving circuit 230 via the conductive flexible board 240; however, it is not limited to this manner in the present invention. As shown in FIG. 3, the driving chip 390 of the electro-phoretic display device 300 can be directly disposed on the driving circuit 230. In other words, it is the chip on glass configuration. In the fabricating method of electro-phoretic display device 300, the opening 352 is formed in the electro-phoretic display layer 350 before disposing the electro-phoretic display layer 350 on the active elements array 220 and the driving circuit 230. In the continuing process, while disposing the electro-phoretic display layer 350 on the active elements array 220 and the driving circuit 230, it is required to exposing the driving chip 390 from the opening 352 to maintain flatness of the electro-phoretic layer 350.

Continue to refer to FIG. 3, more particularly, after the disposition of the electro-phoretic display layer 350, the opening 352 can be filled with the filling layer 360 to improve the structure intensity of the electro-phoretic display layer 350.

As described above, the electro-phoretic display device of the present invention covers both the active elements array and the driving circuit. The electro-phoretic display layer not only changes their transparency according to variation of an electric field in the display area to enable the electro-phoretic display device to display an image, but also acts as a protective layer of the driving circuit. Specifically, because the driving circuit is only covered with the electro-phoretic display layer, it is capable of avoiding damage to the driving circuit caused by uneven thermal stress when ambient temperature of the electro-phoretic display device of the present invention changes.

On the other hand, the sealant of the present electro-phoretic display device is disposed at the edge of the driving circuit, thus the damage to the driving circuit caused by poor quality of process for forming sealant can be reduced. In summary, the present invention not only improves the life time of the electro-phoretic display device, but also improves the yield rate of the electro-phoretic display device.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. An electro-phoretic display device, comprising:
 a first substrate, having a first surface, and the first surface comprising a display area and a circuit area;
 an active elements array, disposed in the display area of the first substrate;
 a driving circuit, disposed in the circuit area of the first substrate, electrically connected to the active elements array;
 a conductive flexible board, partially disposed on the first substrate and being electrically connected to and controlling the driving circuit;
 an electro-phoretic display layer, covered the active elements array and the driving circuit; and
 a second substrate disposed on the electro-phoretic display layer.

2. The electro-phoretic display device of claim 1, further comprising a driving chip disposed in the circuit area of the first substrate and being electrically connected to the drive circuit, the elector-phoretic display layer defining an opening exposing the driving chip.

3. The electro-phoretic display device of claim 1, further comprising a driving chip, and the conductive flexible board being a flexible printed circuit board (FPCB), the driving chip being disposed on the FPCB.

4. The electro-phoretic display device of claim 1, wherein the first substrate is made of plastic.

5. The electro-phoretic display device of claim 4, wherein the first substrate is made of: polyimide (PI), polyethylene terephthalate (PET), polyethylene naphthalate (PEN), aromatic polyamide, polycyclic olefin, polysulfone (PSU), epoxy resin, polycarbonate (PC), or polymethyl methacrylate (PMMA).

6. The electro-phoretic display device of claim 4, further comprising a flexible support plate adhered to a second surface of the first substrate, and the second surface being opposite to the first surface.

7. The electro-phoretic display device of claim 1, wherein the electro-phoretic display layer comprises a micro-cup electro-phoretic display layer, or a micro-capsule electro-phoretic display layer.

8. A fabricating method of electro-phoretic display device, comprising:
 providing a first substrate having a first surface, and the first surface comprising a display area and a circuit area;
 forming an active elements array and a driving circuit in the display area and the circuit area of the first substrate respectively, the active elements array and the driving circuit being electrically connected to each other and the driving circuit being used for controlling the active elements array;
 partially disposing a conductive flexible board on the first substrate and to electrically connect the conductive flexible board to the driving circuit;
 disposing an electro-phoretic display layer to cover the active elements array and the driving circuit; and
 forming a second substrate on the electro-phoretic display layer.

9. The fabricating method of claim 8, further comprising the step of disposing a driving chip on the driving circuit before disposing the electro-phoretic display layer on the active elements array and the driving circuit.

10. The fabricating method of claim 9, wherein before disposing the electro-phoretic layer on the active elements array and the driving circuit, further comprising the step of forming an opening in the electro-phoretic display layer, and after the electro-phoretic layer being disposed on the active elements array and the driving circuit, the opening exposing the driving chip.

11. The fabricating method of claim 10, further comprising the step of filling a filling layer in the opening after disposing the electro-phoretic display layer on the active elements array and the driving circuit.

12. The fabricating method of claim 8, further comprising the step of disposing a driving chip on the conductive flexible board before disposing the conductive flexible board on the first substrate.

13. The fabricating method of claim 8, wherein the steps of forming the first substrate comprising:
 providing a rigid base;
 forming a plastic layer on the rigid base; and
 solidifying the plastic layer to obtain the first substrate.

14. The fabricating method of claim 13, wherein a method of forming the plastic layer comprising: spin coating, ink-jet printing, screen printing, or slit coating.

15. The fabricating method of claim 13, further comprising the step of separating the rigid base and the first substrate after forming the second substrate.

16. The fabricating method of claim 15, further comprising the step of adhering a flexible support plate on a second surface of the first substrate after separating the rigid base and the first substrate, the second surface being opposite to the first surface.

17. The fabricating method of claim 15, wherein separating the rigid base and the first substrate is performed by a laser process.

18. The fabricating method of claim 17, wherein the wavelength of the laser used in separating the rigid base and the first substrate is in a range from 300 nanometers to 400 nanometers.

19. An electro-phoretic display device, comprising:
 a first substrate, having a first surface, and the first surface comprising a display area and a circuit area;

an active elements array, disposed in the display area of the first substrate;

a driving circuit, disposed in the circuit area of the first substrate, and being electrically connected to the active elements array;

a conductive flexible board, partially disposed on the first substrate and being electrically connected to the driving circuit;

an electro-phoretic display layer, disposed on the active elements array and the driving circuit;

a second substrate disposed on the electro-phoretic display layer; and a driving chip, wherein the conductive flexible board being a flexible printed circuit board (FPCB), the driving chip being disposed on the FPCB.

* * * * *